(12) United States Patent
Bonakdar et al.

(10) Patent No.: US 11,515,437 B2
(45) Date of Patent: Nov. 29, 2022

(54) LIGHT SENSING SYSTEM AND LIGHT SENSOR WITH POLARIZER

(71) Applicant: OMNIVISION TECHNOLOGIES, INC., Santa Clara, CA (US)

(72) Inventors: Alireza Bonakdar, San Jose, CA (US); Shinn-Jhy Lian, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 77 days.

(21) Appl. No.: 16/703,542

(22) Filed: Dec. 4, 2019

(65) Prior Publication Data

US 2021/0175378 A1 Jun. 10, 2021

(51) Int. Cl.
*H01L 31/0232* (2014.01)
*H01L 31/0216* (2014.01)
*H01L 31/02* (2006.01)
*G02B 5/30* (2006.01)
*H01L 27/146* (2006.01)

(52) U.S. Cl.
CPC ...... *H01L 31/02327* (2013.01); *G02B 5/3058* (2013.01); *H01L 27/14625* (2013.01); *H01L 27/14636* (2013.01); *H01L 27/14643* (2013.01); *H01L 31/02005* (2013.01); *H01L 31/02019* (2013.01); *H01L 31/02161* (2013.01); *H01L 27/14627* (2013.01)

(58) Field of Classification Search
CPC ......... H01L 31/02327; H01L 31/02161; H01L 31/02005; H01L 31/02019; H01L 27/14625; H01L 27/14636; H01L 27/14643; H01L 27/14627; H01L 27/14621; G02B 5/3058
See application file for complete search history.

(56) References Cited

U.S. PATENT DOCUMENTS

| | | | | |
|---|---|---|---|---|
| 8,310,575 | B2* | 11/2012 | Sato | H01L 27/14632 348/294 |
| 9,153,610 | B2* | 10/2015 | Kobayashi | H04N 5/335 |
| 9,842,870 | B2* | 12/2017 | Chung | H01L 27/14621 |
| 10,319,765 | B2* | 6/2019 | Kato | H04N 7/183 |
| 10,748,953 | B2* | 8/2020 | Cho | H01L 27/1462 |
| 2006/0163451 | A1* | 7/2006 | Park | H01L 27/14627 250/208.1 |
| 2007/0194356 | A1* | 8/2007 | Moon | H01L 27/1463 257/291 |
| 2008/0036023 | A1* | 2/2008 | Park | H01L 27/14685 257/432 |

(Continued)

*Primary Examiner* — Bitew A Dinke
(74) *Attorney, Agent, or Firm* — Perkins Coie LLP

(57) ABSTRACT

A light sensor includes a photodiode, interlayer dielectric layer and plurality of metal layers. A polarizer is disposed in the plurality of metal layers. The photodiode is coupled to generate charge in response to incident light directed through a first side of the semiconductor layer. The polarizer includes a first metal grid formed with a first metal layer and a second metal grid formed with a third metal layer. The second metal grid is stacked with the first metal grid such that the first and second metal grids are disposed above and aligned with the photodiode. The photodiode is optically coupled to receive incident light through the first and second metal grids of the polarizer and through the first side of the semiconductor layer.

19 Claims, 7 Drawing Sheets

(56) References Cited

U.S. PATENT DOCUMENTS

| | | | |
|---|---|---|---|
| 2008/0251874 A1* | 10/2008 | Ishibe | H01L 27/14687 257/432 |
| 2009/0014824 A1* | 1/2009 | Sakoh | H01L 27/14627 257/432 |
| 2009/0065821 A1* | 3/2009 | Lee | H01L 27/14621 257/292 |
| 2009/0230394 A1* | 9/2009 | Nagaraja | H01L 27/14621 257/59 |
| 2010/0144084 A1* | 6/2010 | Doan | H01L 31/02327 438/72 |
| 2010/0230578 A1* | 9/2010 | Horikoshi | H01L 27/14629 257/E31.127 |
| 2011/0116078 A1* | 5/2011 | Cho | H01L 27/14625 356/51 |
| 2012/0199894 A1* | 8/2012 | Furuya | H01L 27/1461 257/292 |
| 2013/0235237 A1* | 9/2013 | Aoki | H01L 27/14605 348/294 |
| 2013/0309802 A1* | 11/2013 | Horikoshi | H01L 27/14629 438/69 |
| 2014/0375826 A1* | 12/2014 | Lee | H01L 27/307 257/40 |
| 2015/0001663 A1* | 1/2015 | Lee | H01L 27/14627 257/432 |
| 2015/0035104 A1* | 2/2015 | Horikoshi | H01L 27/14685 438/69 |
| 2015/0048469 A1* | 2/2015 | Jung | H01L 27/14621 257/432 |
| 2015/0115339 A1* | 4/2015 | Tamaki | H04N 5/3745 257/292 |
| 2015/0206912 A1 | 7/2015 | Kanamori et al. | |
| 2016/0027821 A1* | 1/2016 | Ahn | H01L 27/1464 257/446 |
| 2016/0211388 A1* | 7/2016 | Natsuaki | H01L 27/14629 |
| 2017/0033147 A1* | 2/2017 | Chung | H01L 27/14629 |
| 2017/0170238 A1* | 6/2017 | Lee | H01L 27/14621 |
| 2017/0294472 A1* | 10/2017 | Kumano | H01L 27/1464 |
| 2018/0175091 A1* | 6/2018 | Jeon | H01L 27/14645 |
| 2018/0286908 A1* | 10/2018 | Yamazaki | H01L 27/14645 |
| 2018/0302597 A1* | 10/2018 | Honda | G02B 5/201 |
| 2018/0308892 A1* | 10/2018 | Kumano | H01L 27/14643 |
| 2019/0006407 A1* | 1/2019 | Uesaka | H01L 27/14625 |
| 2019/0019823 A1* | 1/2019 | Ooki | H01L 25/0657 |
| 2019/0172865 A1* | 6/2019 | Cho | H01L 27/14687 |
| 2019/0252466 A1* | 8/2019 | Yoo | H01L 27/307 |
| 2020/0119073 A1* | 4/2020 | Machida | H01L 27/14625 |
| 2020/0152683 A1* | 5/2020 | Akiyama | H04N 5/369 |

\* cited by examiner

LIGHT SENSING SYSTEM AND LIGHT SENSOR WITH POLARIZER

BACKGROUND INFORMATION

Field of the Disclosure

This disclosure relates generally to arrays of light sensors, in particular to arrays of light sensors with polarizers.

Background

Light sensors may be used in various devices including cameras, sensors, and consumer electronics. Light sensors may include polarizers and photodiodes so that polarized light is sensed at the photodiodes. The addition of polarizers can increase the complexity and cost of manufacturing light sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
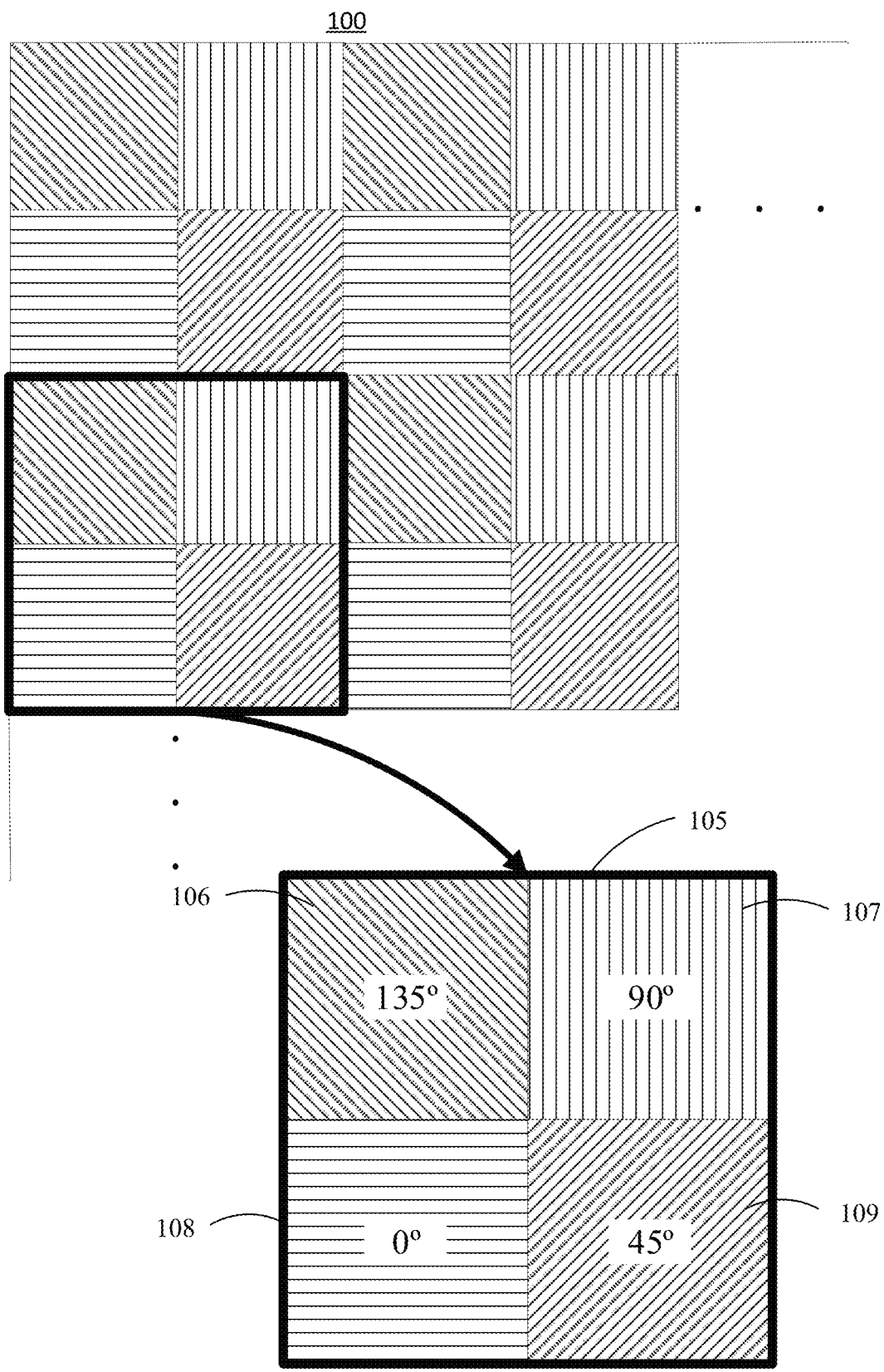
FIG. 1 is a diagram illustrating one example light sensor array in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to light sensors and devices are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Light sensors including polarizers often have greater cost of manufacture than light sensors without polarizers because the addition of the polarizer causes additional manufacturing steps to be performed.

In a front side illuminated light sensor, metal conductors are formed in layers above a photodiode and below a microlens focusing incident light onto the photodiode. Many or all of the components of a polarizer can be formed at the same time and in the same layers as the conductors. Accordingly, a cost and complexity of manufacturing a light sensor with a polarizer may be reduced by forming the light sensor with components of the polarizer in the same layer as the conductors.

Crosstalk between individual photodiodes in a light sensor array may be caused by incident light which is not confined, because of reflections or other causes. The inclusion of one or more peripheral rings with the polarizer may confine the incident light directed through the polarizer to be directed to the photodiode and also confine light arriving at a low angle from outside of the polarizer from going to the photodiode.

As will be discussed, example light sensors disclosed herein reduce cost and complexity and improve the performance of the light sensors.

FIG. 1 is a diagram illustrating one example light sensor array 100 in accordance with the teachings of the present invention. The light sensor array 100 may include a plurality of light sensors 106-109 arranged in groups of light sensors 105. The light sensor array 100 may extend in a first plane (in this description referred to as "horizontal plane" although the light sensor array 100 may have any orientation). The individual light sensors 106-109 may also be considered pixels. In a group of light sensors 105, a first light sensor 106 may have a polarizer at an angle of 135°, a second light sensor 107 may have a polarizer at an angle of 90°, a third light sensor 108 may have a polarizer at an angle of 0°, and a fourth light sensor 109 may have a polarizer at an angle of 45°. Each of the first-fourth light sensors 106-109 will share sides with light sensors 106-109 having a polarizer at an angle 45° different from its own.

The light sensor array 100 may have any dimensions. However, because the light sensors 106-109 are arranged in groups of light sensors 105, the dimensions of the light sensor array 100 will generally be an even number.

Figure 2A:
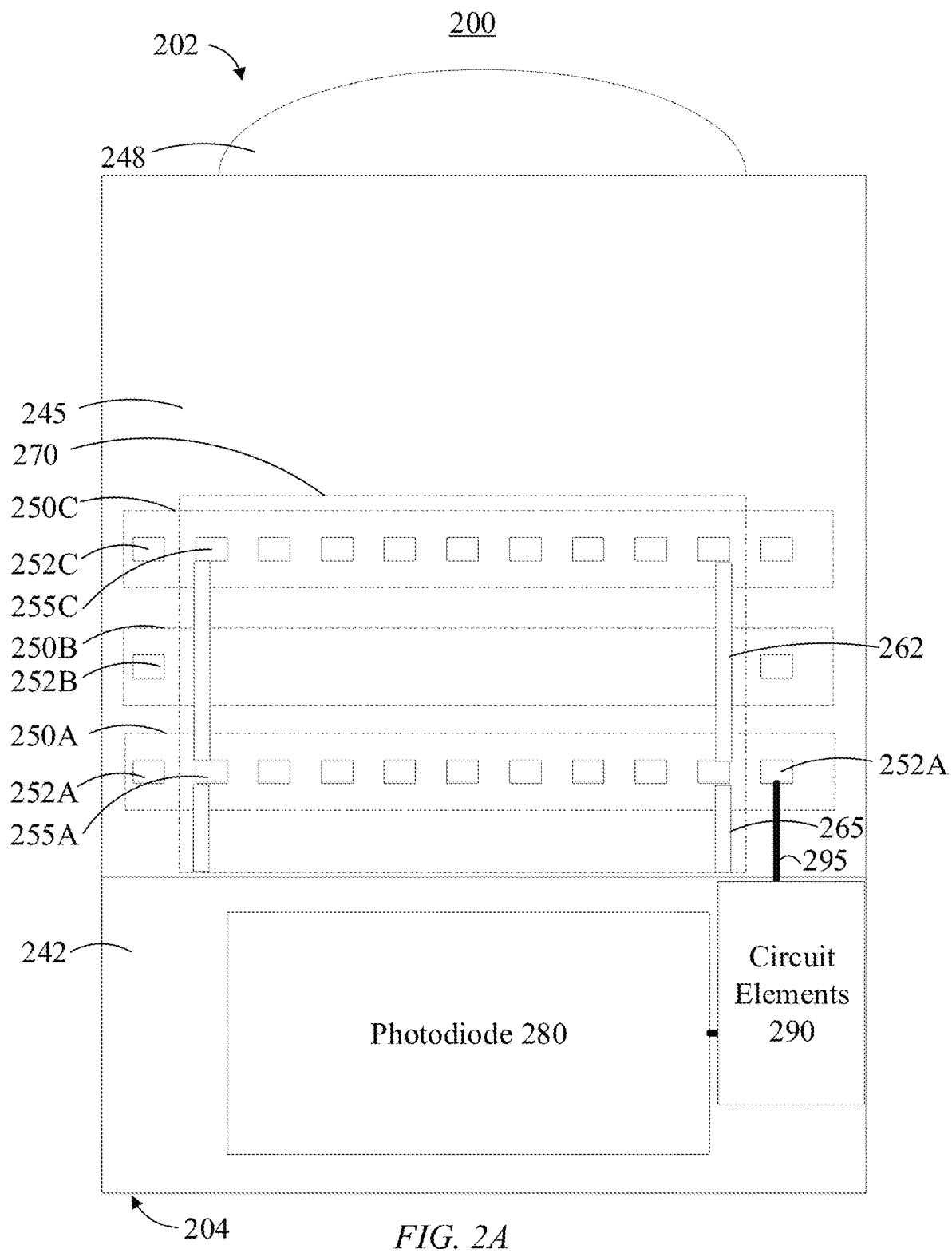
FIGS. 2A-2B illustrate example vertical cross-section views of light sensors in accordance with the teachings of the present invention.
Figure 2B:
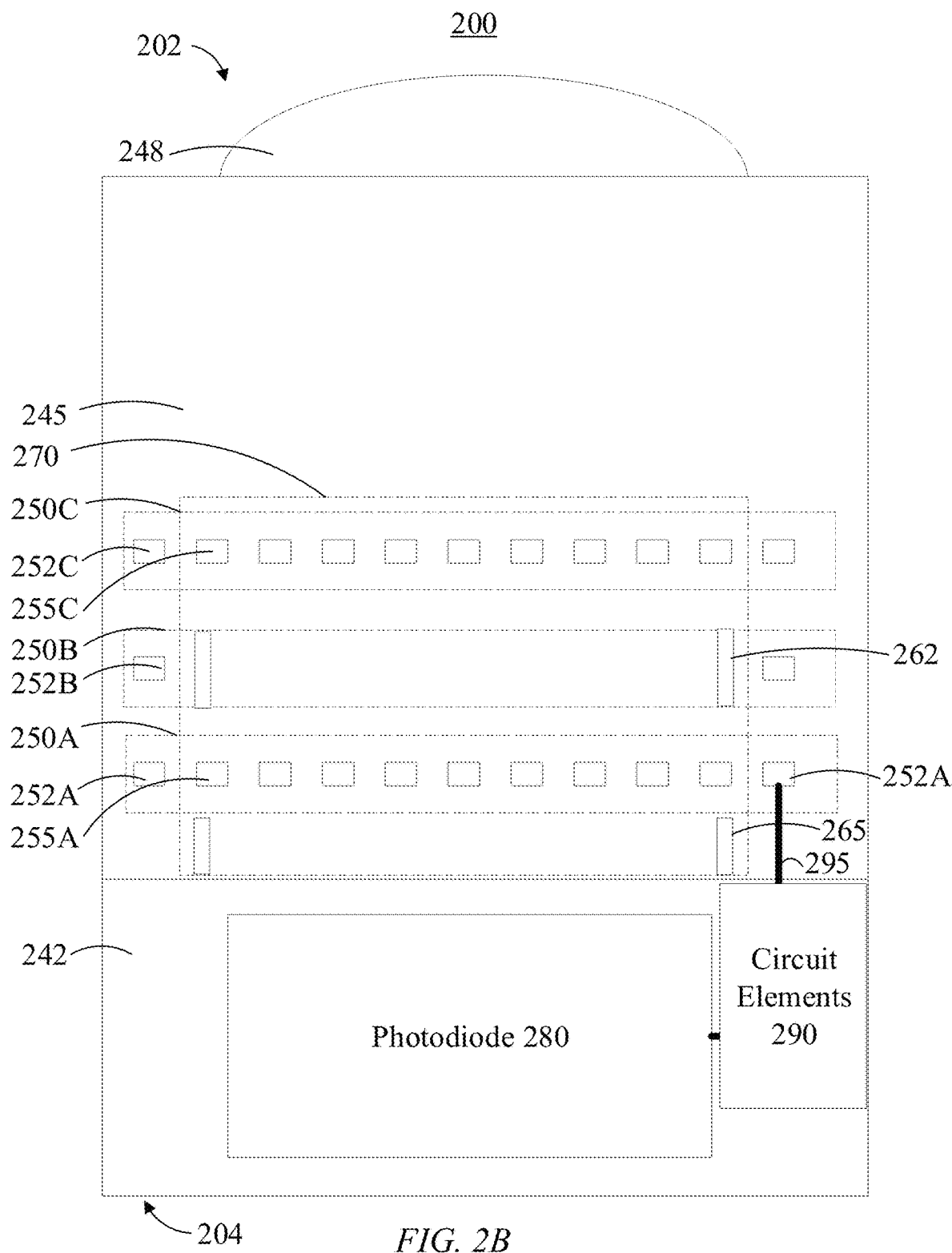

FIGS. 2A-2B illustrate example vertical cross-section views of light sensors 200 in accordance with the teachings of the present invention. FIG. 2A illustrates a light sensor 200 including a semiconductor layer 242, an interlayer dielectric layer 245 and a microlens 248. The light sensor 200 has a front side 202 and a back side 204 opposite the front side 202.

The semiconductor layer 242 may be made of a semiconductor material such as silicon. The semiconductor layer includes a photodiode 280 and circuit elements 290. The photodiode 280 generates charge in response to incident light directed through the front side 202 of the light sensor 200. The circuit elements 290 are coupled to the photodiode. The circuit elements 290 may be controlled by the control circuitry to perform various functions including controlling the transfer of the generated charge and providing an output to readout circuitry. The circuit elements 290 may include transfer gates, capacitors, transistors, and other elements configured to control the transfer of the generated charge and provide an output signal to readout circuitry. At least one of the circuit elements 290 may be disposed proximate to a front side 202 of the semiconductor layer 242.

The interlayer dielectric layer 245 may be formed of a transparent or color filtering dielectric material. The interlayer dielectric layer 245 includes several metal layers 250A-C formed therein which extend in a horizontal plane. In one example embodiment there may be three metal layers 250A-C. In other example embodiments, there may be a different number of metal layers 250A-C. The metal layers 250A-C each include conductors 252A-C, which are above but not aligned with the photodiode 280 such that they do not interfere with the path of incident light from the microlens 248 to the photodiode 280. The conductors 252A-C may be connected to the circuit elements 290 by connectors 295. The conductors 252A-C may connect the circuit elements 290 to control circuitry and readout circuitry outside of the light sensor 200 via the connectors 295. For clarity in illustrating the conductors 252A-C, a single conductor is shown on either side of the metal layers 250A-C, however, any number of conductors 252A-C may be included in each metal layer 250A-C. Further, any number of connectors 295 may connect the circuit elements 290 to any of the conductors 252A-C.

The interlayer dielectric layer 245 may also have a polarizer 270 formed therein. The polarizer 270 may include a first metal grid 255A, second metal grid 255C. A first peripheral ring 262 and second peripheral ring 265 may surround portions of the polarizer 270. The polarizer 270 is disposed above and aligned with the photodiode such that the polarizer 270 polarizes incident light traveling from the microlens 248 to the photodiode 280. Thus, the microlens 248 is arranged to focus incident light onto the photodiode 280 through the polarizer 270.

The first and second metal grids 255A, 255C include a plurality of parallel metal sections which polarize the incident light. The second metal grid 255C is stacked with the first metal grid 255A such that the first and second metal grids 255A, 255C are disposed above and aligned with the photodiode 280. The first and second metal grids 255A, 255C have the same polarizing orientation and are vertically spaced apart such that a lateral misalignment of the first and second metal grids 255A, 255C will not substantially affect the intensity of the polarized light at the photodiode 280 (compared to being perfectly aligned). In the illustrated example, the vertical spacing is achieved by not including a metal grid in the second metal layer 250B. For example, the vertical separation between the first and second metal grids 255A, 255C may be about 600 nm or greater. The inclusion of two metal grids 255A, 255C with a vertical separation between the metal grids 255A, 255C allows for a larger pitch between the parallel sections without sacrificing performance. A polarizer including only a single metal grid would require a significantly smaller pitch between the parallel sections in order to have the same performance. The smaller pitch would increase complexity and cost in forming the metal grid.

Each of the light sensors 106-109 in the group of light sensors 105 includes the first and second metal grids 255A, 255C with a polarization orientation different from a polarization orientation of the first and second metal grids 255A, 255C of the other light sensors 106-109 of the group of light sensors 105.

The first and second peripheral rings 262, 265 are disposed above the photodiode 280 and aligned close to edges of the photodiode 280 when viewed from the front side 202. The first and second peripheral rings 262, 265 act to confine the incident light directed through the polarizer 270 to be directed to the photodiode 280, and also to confine light which did not pass through the second metal grid 255C to outside of the polarizer 270. Thus, the photodiode 280 is optically coupled to receive the incident light through the first and second metal grids 255A, 255C of the polarizer 270 and through the front side 202 of the semiconductor layer 242.

As shown in the illustrated example, the first peripheral ring 262 may extend substantially the entire distance between the first metal grid 255A and the second metal grid 255C. In some example embodiments the first peripheral ring 262 may directly contact the first metal grid 255A and the second metal grid 255C. The second peripheral ring 265 may extend substantially the entire distance between the semiconductor layer 242 and first metal grid 255A. In some example embodiments, the second peripheral ring 265 may directly contact the semiconductor layer 242 and first metal grid 255A. The first and second peripheral rings 262, 265 may be formed of metal deposited in a via trench or a similar structure. The first and second peripheral rings assist in preventing cross talk between the light sensors 200 in the light sensor array 100. The height of the first and second peripheral rings 262, 265 may be adjusted based on the tolerance of the image sensing system of crosstalk between the light sensors 200. Also, in some example embodiments, the second peripheral ring 265 may not be included.

The first and second metal grids 255A, 255C may be formed in the first and third metal layer 250A, 250C, respectively. Restated, the first and second metal grids 255A, 255C may be formed at the same depth in the interlayer dielectric layer 245 as the first and third conductors 252A, 252C, respectively. This feature provides a significant advantage in the manufacture of the light sensor 200 because this allows the first and second metal grids 255A, 255C to be formed in the same operation as the first and third conductors 252A, 252C, respectively, thus reducing the number of steps needed to form the front side illuminated light sensor 200 with a polarizer 270.

FIG. 2B illustrates a light sensor 200 similar to the light sensor 200 of FIG. 2A except that the first and second peripheral rings 262, 265 are different. The first peripheral ring 262 is formed entirely in the second metal layer 250B. This provides the advantage of reducing the number of steps to form the light sensor 200 with the polarizer 270. The second peripheral ring 265 extends between the semiconductor layer 242 and first metal grid 255A but does not directly contact the semiconductor layer 242 and first metal grid 255A.

Figure 3A:
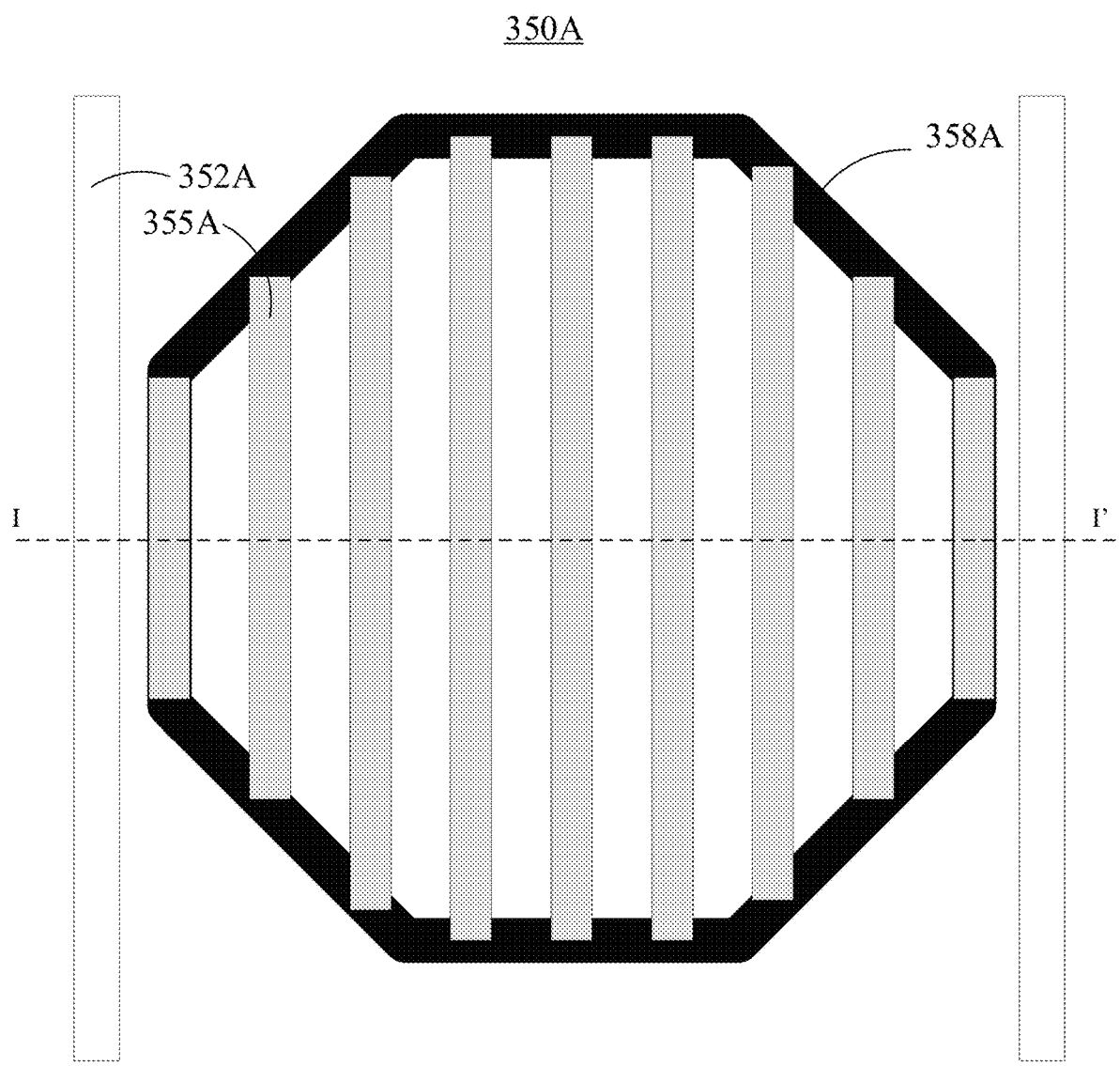
FIGS. 3A-3C illustrate example horizontal cross-section views of metal layers of light sensors in accordance with the teachings of the present invention.
Figure 3B:
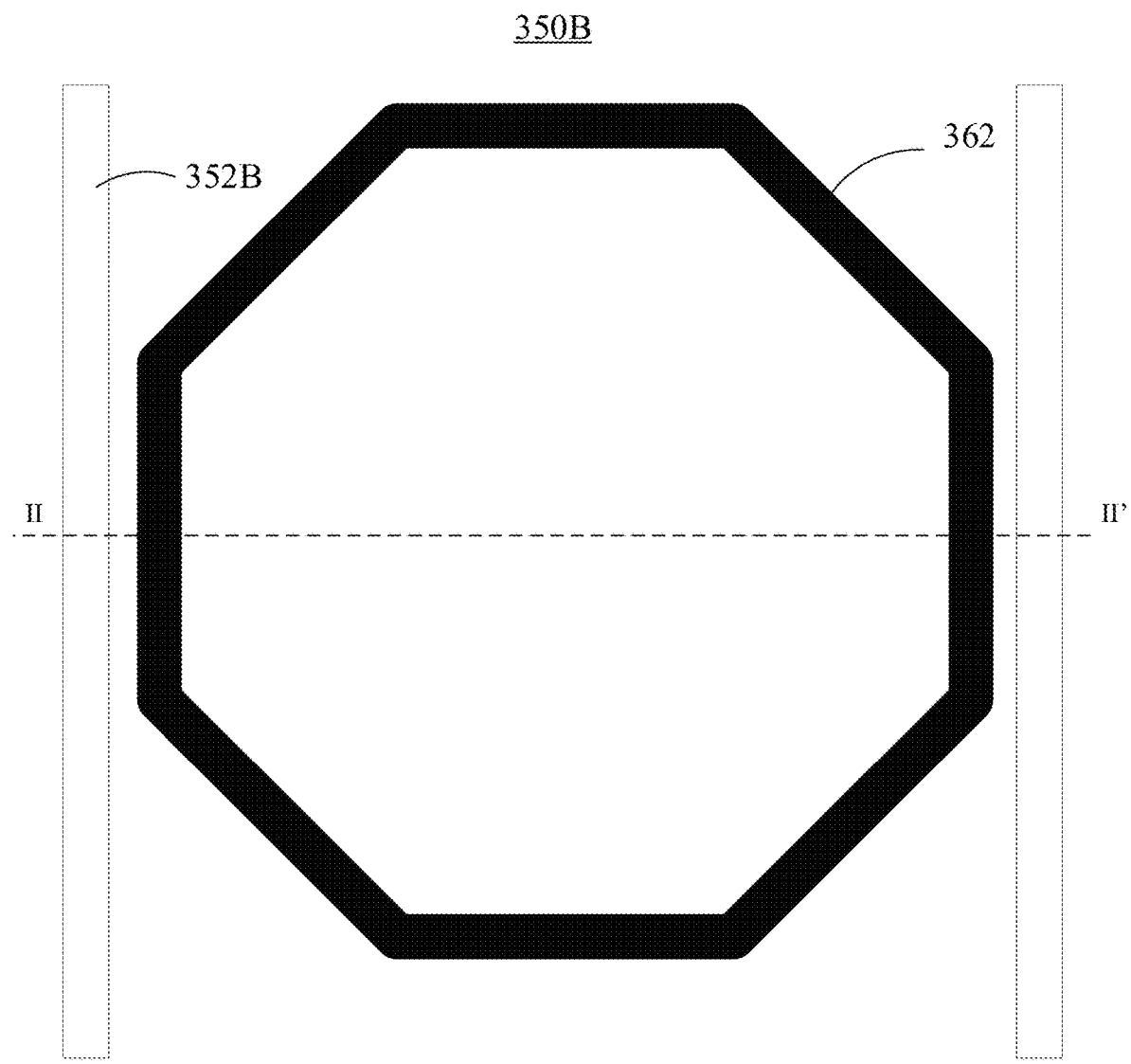
Figure 3C:
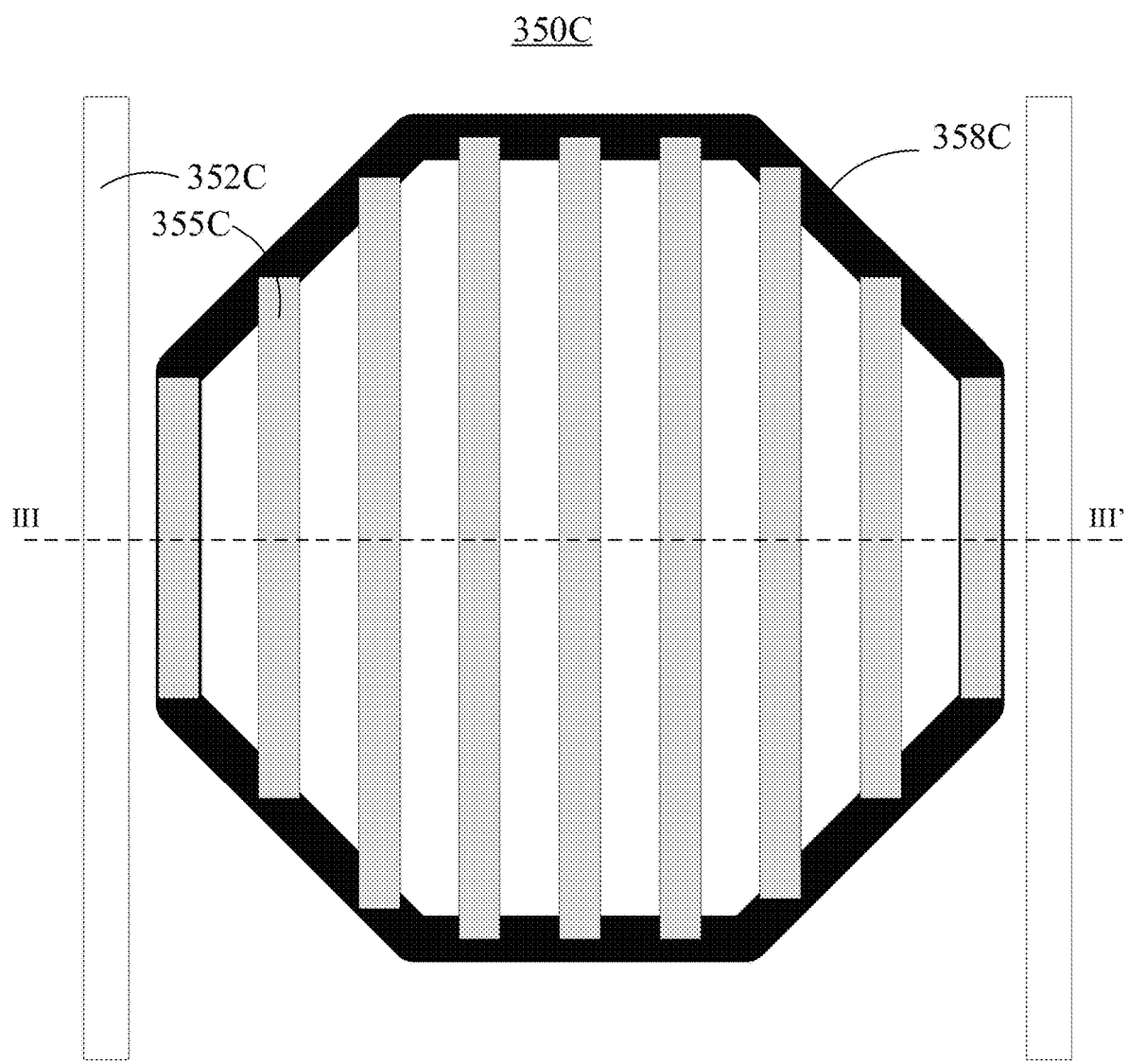

FIGS. 3A-3C illustrate example horizontal cross-section views of the metal layers 350A-C of light sensors 200 in accordance with the teachings of the present invention. FIG. 3A illustrates an example cross section view of the first metal layer 350A. The first metal layer 350A includes first conductors 352A, first metal grid 355A, and first peripheral structure 358A. The first metal grid 355A includes parallel sections connected to the first peripheral structure 358A. In one example embodiment, the parallel sections of the first metal grid 355A may have a width of about 130-140 nm, a pitch (horizontal separation between the parallel sections) of about 260 nm, and height of about 450 nm. The first peripheral structure 358A provides structural support for the first metal grid 355A and also acts to confine the incident light along with the first and second peripheral rings 262, 265. All of the elements in the first metal layer 350A may be formed at the same time of the same metal, thus, reducing the complexity and number of steps for forming a light sensor 200 with a polarizer 270.

FIG. 3B illustrates an example cross section view of the second metal layer 350B. The second metal layer 350B includes the first peripheral ring 362 and second conductors 352B. As discussed above, in some example embodiments, the first peripheral ring 362 may be entirely included in the second metal layer 350B. In these example embodiments, the first peripheral ring 362 and second conductors 352B may be formed of the same metal material in the same operations, thus, reducing the complexity and number of steps for forming the light sensor 200. In other example embodiments, the first peripheral ring 362 may extend above and/or below the second metal layer 350B and may be formed separately.

FIG. 3C illustrates an example cross section view of the third metal layer 350C. The third metal layer 350C includes third conductors 352C, second metal grid 355C, and second peripheral structure 358C. The second metal grid 355C includes parallel sections connected to the second peripheral structure 358C. In one example embodiment, the parallel sections of the second metal grid 355C may have a width of about 180-220 nm, a pitch of about 360 nm, and height of about 170 nm. The second peripheral structure 358C provides structural support for the second metal grid 355C and also acts to confine the incident light along with the first and second peripheral rings 262, 265. All of the elements in the third metal layer 350C may be formed at the same time of the same metal, thus reducing the complexity and number of steps for forming a light sensor 200 with a polarizer 270.

The first and second peripheral structures 358A, 358C may have an octagonal shape when viewed from the front side 202. In other example embodiments, the first and second peripheral structures 358A, 358C may have a square, rectangular, or oval shape. The first peripheral ring 362 may have the same shape as the first and second peripheral structures 358A, 358C. Similarly, the second peripheral ring 265 may have the same shape as the first and second peripheral structures 358A, 358C. This may be advantageous in example embodiments where the first peripheral ring 362 directly connects to the first and second metal grids 355A, 355C because this may help prevent the formation of gaps in the periphery of the photodiode 280 which may allow some crosstalk between light sensors 200. In other example embodiments the first and second peripheral rings 362, 265 may have a different shape from the first and second peripheral structures 358A, 358C.

The metal layers 350A, 350B, 350C may be formed in several different ways. Before forming any of the metal layers 350A, 350B, 350C, metal connectors such as the connectors 295 may be formed in the dielectric material to connect the metal layers 350A, 350B, 350C to a lower layer in the light sensor 200.

One way in which the metal layers may be formed is depositing a layer of metal on dielectric material forming part of the interlayer dielectric layer 245. Then depositing a photoresist layer on the metal layer. Then developing the photoresist layer to create a mask. Then using the mask to etch the layer of metal to form one of the metal layers 350A, 350B, 350C.

A second way in which the metal layer may be formed is by depositing a layer of metal on dielectric material forming part of the interlayer dielectric layer 245. Then using multiple photomask exposures to etch the layer of metal to form one of the metal layers 350A, 350B, 350C. Polarizers for visible light or UV light require precise etching that may not be possible with a single photomask etch. Accordingly, two or more photomasks may be used to etch the layer of metal. Alternatively, the single photomask may be used with a first and second portion. The first portion of the photomask may be used to etch the layer of metal while the second portion is shielded. Then the second portion of the photomask may be adjusted to be over the light sensor 200 and used to etch the layer of metal while the first portion is shielded. This method may be particularly useful when forming the first and second metal grids 355A, 355C because changing masks can lead to misalignments which would limit the quality of the first and second metal grids 355A, 355C as a polarizer 270.

As stated above, the first peripheral ring 362 may be formed with the second metal layer 350B. Alternatively the first peripheral ring 362 may be formed after the second metal layer 350B is formed and before the third metal layer 350C is formed. Dielectric material may be deposited on the second metal layer 350B and then the dielectric material may be etched to form a via-trench which may then have metal deposited therein to form the first peripheral ring 362. In some embodiments the via-trench may extend down to the first metal layer 350A such that the first peripheral ring 362 is formed directly on the first metal grid 355A and first peripheral structure 358A. The second metal grid 355C and second peripheral structure 358C may then be formed directly on the first peripheral ring 362. The second peripheral ring 365 may be formed in a similar manner between the semiconductor layer 242 and the first metal layer 350A before the first metal layer 350A is formed.

Figure 4:
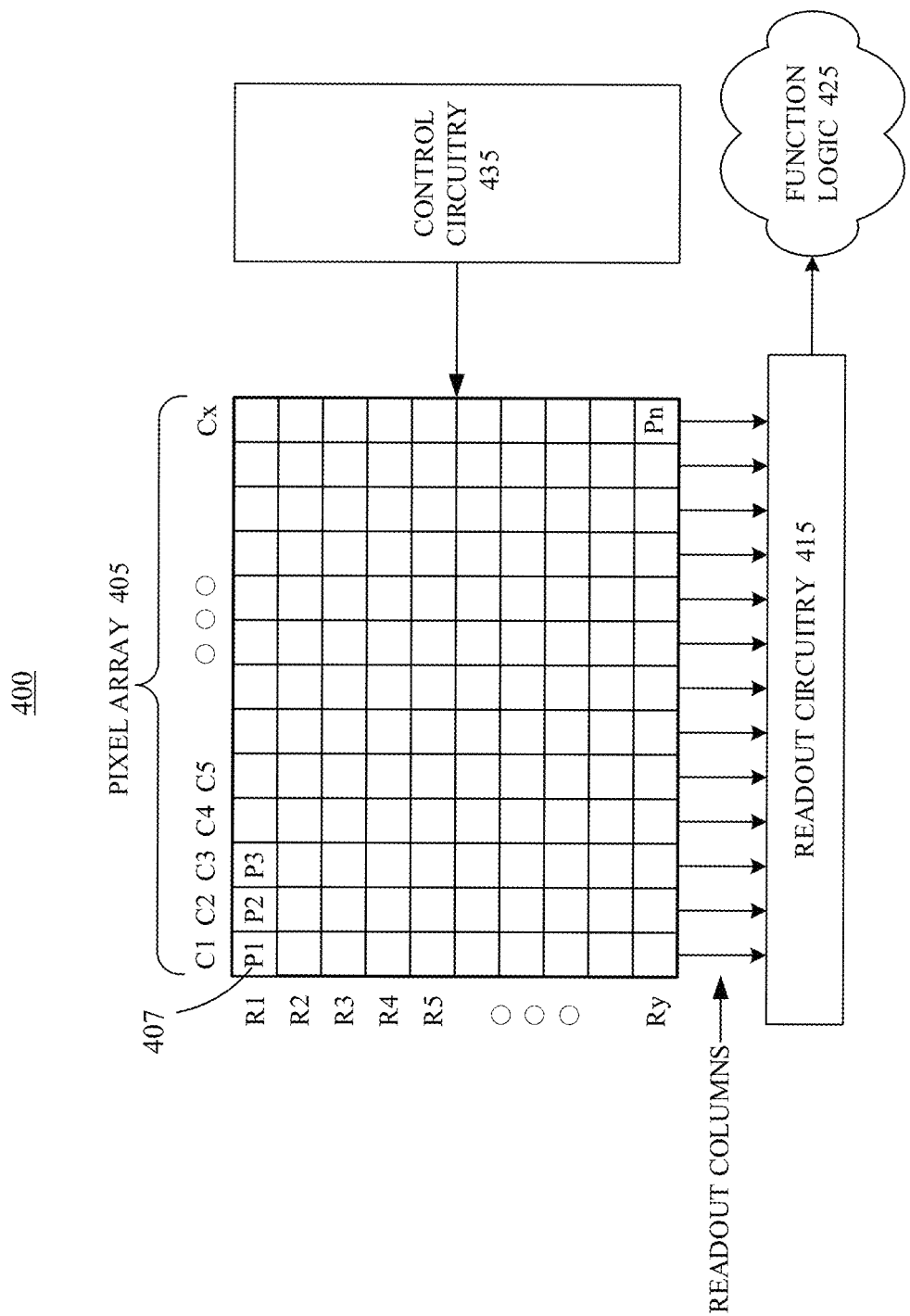
FIG. 4 is a diagram illustrating one example of an imaging system with a light sensor array in accordance with the teachings of the present invention.

FIG. 4 is a diagram illustrating one example of an imaging system 400 with an image sensor array in accordance with the teachings of the present invention. As shown in the depicted example, an imaging system 400 includes a pixel array (image sensor array) 405 coupled to a control circuitry 435 and a readout circuitry 415, which is coupled to a function logic 425.

Pixel array 405 is a two-dimensional ("2D") array of pixels 407 (e.g., pixels P1, P2 . . . , Pn). In one embodiment, each pixel is a complementary metal-oxide-semiconductor ("CMOS") imaging pixel. Pixel array 405 may be implemented as either a front side illuminated light sensor array, or a backside illuminated light sensor array. In one embodiment, pixel array 405 includes pixels 407, such as the light sensors 200 depicted in FIGS. 2A and 2B. The pixel array 405 includes a plurality of pixels 407. As illustrated, each pixel 407 is arranged into a row (e.g., rows R1 to Ry) and a column (e.g., column C1 to Cx) to acquire image data of a person, place, or object, which can then be used to render a 2D image of the person, place, or object.

In one embodiment, after each pixel 407 has acquired its image data or image charge, the image data is readout by readout circuitry 415 and transferred to function logic 425. Readout circuitry 415 may include amplification circuitry, e.g., a differential amplifier circuitry, analog-to-digital ("ADC") conversion circuitry, or otherwise. The readout circuitry 415 receives the image charge or image data via the electrical conductors 252A-C.

Function logic 425 may include logic and memory for storing the image data or even manipulating the image data by applying post image effects (e.g., crop, rotate, remove red eye, adjust brightness, adjust contrast, or otherwise). In one example, the readout circuitry 415 may readout a row of image data at a time along readout column lines (illustrated) or may readout the image data using a variety of other techniques (not illustrated), such as a serial readout or a full parallel readout of all pixels simultaneously. In one embodiment, the function logic 425 may perform mathematical operations on the outputs of each of the outputs from one group of light sensors 105 to determine a polarization of the incident light.

Control circuitry 435 is coupled to pixel array 405. Control circuitry 435 may include logic and memory for controlling operational characteristic of pixel array 405. For example, control circuitry 435 may generate a shutter signal for controlling image acquisition. In one embodiment, the shutter signal is a global shutter signal for simultaneously enabling all pixels 407 within pixel array 405 to simultaneously capture their respective image data during a single acquisition window. In an alternative embodiment, the shutter signal is a rolling shutter signal whereby each row, column, or group of pixels is sequentially enabled during consecutive acquisition windows. The control circuitry 435 is coupled to control transmission of output from each of the light sensors 106-109 to the readout circuitry 415, where the output of each of the plurality of light sensors 200 is based on the charge generated by the photodiode 280.

As can be appreciated by the above description of the light sensor with the polarizer formed in the metal layers which include the conductors for coupling the circuit elements to the control circuitry and readout circuitry improves performance and reduces complexity of manufacture of the device.

The above description of illustrated examples of the present invention, including what stop is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A light sensor, comprising:
   a photodiode of a plurality of photodiodes disposed in a semiconductor layer, wherein the photodiode is coupled to generate charge in response to incident light directed through a first side of the semiconductor layer;
   an interlayer dielectric layer disposed proximate to the first side of the semiconductor layer;
   a plurality of metal layers disposed in the interlayer dielectric layer, wherein the plurality of metal layers includes electrical conductors coupled to circuit elements disposed proximate to the first side the semiconductor layer, wherein the circuit elements are coupled to the photodiode, wherein the plurality of metal layers includes a first metal layer, a second metal layer, and a third metal layer; and
   a polarizer disposed in the plurality of metal layers, wherein the polarizer is vertically offset from the photodiode, and wherein the polarizer comprises:
   a first metal grid of the polarizer, the first metal grid comprising a first plurality of parallel sections formed within the first metal layer, wherein the first plurality of parallel sections is vertically offset above and aligned with its corresponding photodiode;
   a second metal grid of the polarizer, the second metal grid comprising a second plurality of parallel sections formed within the third metal layer, wherein the second plurality of parallel sections is vertically offset above and aligned with its corresponding photodiode, and wherein the second metal grid is stacked with the first metal grid; and
   a first peripheral ring vertically extending between the first metal grid and the second metal grid, wherein the first peripheral ring surrounds portions of the first metal grid and the second metal grid, wherein the first metal grid is at least partially connected at one end of the first peripheral ring and the second metal grid is at least partially connected at an opposite end of the first peripheral ring,
   wherein the photodiode of the plurality of photodiodes is optically coupled to receive the incident light passing through spaces between individual structures of the first plurality of parallel sections of the first metal grid and through spaces between individual structures of the second plurality of parallel sections of the second metal grid of the corresponding polarizer and through the first side of the semiconductor layer.

2. The light sensor of claim 1, wherein the second metal grid has a same polarizing orientation as the first metal grid.

3. The light sensor of claim 1, wherein the first peripheral ring is configured to confine the incident light directed through the polarizer to be directed to the photodiode, wherein the first peripheral ring is metal.

4. The light sensor of claim 3, wherein the second metal layer includes the first peripheral ring.

5. The light sensor of claim 3, further comprising a second peripheral ring disposed between the first metal layer and the semiconductor layer to confine the incident light directed through the polarizer to be directed to the photodiode, wherein the second peripheral ring is metal.

6. The light sensor of claim 1, wherein the first metal grid includes a first plurality of parallel sections, and wherein the second metal grid includes a second plurality of parallel sections.

7. The light sensor of claim 6, wherein the first metal grid includes a first peripheral structure, wherein the first plurality of parallel sections are connected to the first peripheral structure, wherein the second metal grid includes a second peripheral structure, wherein the second plurality of parallel sections are connected to the second peripheral structure.

8. The light sensor of claim 1, wherein the first metal grid and the second metal grid are vertically spaced apart in the interlayer dielectric layer.

9. The light sensor of claim 1, wherein the first side of the semiconductor layer is a front side of the semiconductor layer, wherein a second side of the semiconductor layer that is opposite the first side is a backside of the semiconductor layer.

10. The light sensor of claim 1, wherein the first peripheral ring restricts light incident on the photodiode to light that passed through the polarizer.

11. A light sensing system comprising:
a plurality of light sensors, each of the light sensors including:
a photodiode of a plurality of photodiodes disposed in a semiconductor layer, wherein the photodiode is coupled to generate charge in response to incident light directed through a first side of the semiconductor layer;
an interlayer dielectric layer disposed proximate to the first side of the semiconductor layer;
a plurality of metal layers disposed in the interlayer dielectric layer, wherein the plurality of metal layers includes electrical conductors coupled to circuit elements disposed proximate to the first side the semiconductor layer, wherein the circuit elements are coupled to the photodiode, wherein the plurality of metal layers includes a first metal layer, a second metal layer, and a third metal layer; and
a polarizer disposed in the plurality of metal layers, wherein the polarizer is vertically offset from the photodiode, and wherein the polarizer comprises:
a first metal grid of the polarizer, the first metal grid comprising a first plurality of parallel sections formed within the first metal layer, wherein the first plurality of parallel sections is vertically offset above and aligned with its corresponding photodiode;
a second metal grid of the polarizer, the second metal grid comprising a second plurality of parallel sections formed within the third metal layer, wherein the second plurality of parallel sections is vertically offset above and aligned with its corresponding photodiode, and wherein the second metal grid is stacked with the first metal grid; and
a first peripheral ring vertically extending between the first metal grid and the second metal grid, wherein the first peripheral ring surrounds portions of the first metal grid and the second metal grid, wherein the first metal grid is at least partially connected at one end of the first peripheral ring and the second metal grid is at least partially connected at an opposite end of the first peripheral ring,
wherein the photodiode of the plurality of photodiodes is optically coupled to receive the incident light passing through spaces between individual structures of the first plurality of parallel sections of the first metal grid and through spaces between individual structures of the second plurality of parallel sections of the second metal grid of the corresponding polarizer and through the first side of the semiconductor layer;
control circuitry coupled to control transmission of output from each of the plurality of light sensors, wherein the output of each of the plurality of light sensors is based on the charge generated by the photodiode; and
readout circuitry coupled to receive an output from each of the plurality of light sensors,
wherein the plurality of light sensors are arranged in groups of light sensors, wherein each of the light sensors in a group of light sensors among the groups of light sensors includes the first and second metal grids with a polarization orientation different from a polarization orientation of the first and second metal grids of the other light sensors of the group of light sensors.

12. The light sensing system of claim 11, wherein at least one of the electrical conductors of the plurality of metal layers is electrically connected to the circuit elements.

13. The light sensing system of claim 11, wherein in each light sensor the second metal grid has the same polarizing orientation as the first metal grid.

14. The light sensing system of claim 11, wherein the first peripheral ring disposed between the first metal layer and the third metal layer is configured to confine the incident light directed through the polarizer to be directed to the photodiode, wherein the first peripheral ring is metal.

15. The light sensing system of claim 14, wherein the second metal layer includes the first peripheral ring.

16. The light sensing system of claim 14, further comprising a second peripheral ring disposed below the first metal layer to confine the incident light directed through the polarizer to be directed to the photodiode, wherein the second peripheral ring is metal.

17. The light sensing system of claim 11, wherein the first metal grid and the second metal grid each include a peripheral structure connected to a plurality of parallel sections.

18. The light sensing system of claim 11, wherein the readout circuitry receives the output via the electrical conductors.

19. The light sensing system of claim 11, wherein the first side of the semiconductor layer is a front side of the semiconductor layer, wherein a second side of the semiconductor layer that is opposite the first side is a backside of the semiconductor layer.

* * * * *